(12) United States Patent
Rudmann et al.

(10) Patent No.: US 9,746,349 B2
(45) Date of Patent: Aug. 29, 2017

(54) OPTO-ELECTRONIC MODULE INCLUDING A NON-TRANSPARENT SEPARATION MEMBER BETWEEN A LIGHT EMITTING ELEMENT AND A LIGHT DETECTING ELEMENT

(71) Applicant: Heptagon Micro Optics Pte. Ltd., Singapore (SG)

(72) Inventors: Hartmut Rudmann, Jona (CH); Alexander Bietsch, Thalwil (CH); Susanne Westenhöfer, Wettswil (CH); Simon Gubser, Weesen (CH); Samuele Laffranchini, Adliswil (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/915,567

(22) PCT Filed: Sep. 2, 2013

(86) PCT No.: PCT/SG2013/000380
§ 371 (c)(1),
(2) Date: Feb. 29, 2016

(87) PCT Pub. No.: WO2015/030673
PCT Pub. Date: Mar. 5, 2015

(65) Prior Publication Data
US 2016/0216138 A1    Jul. 28, 2016

(51) Int. Cl.
*G01J 1/00*    (2006.01)
*G01D 5/40*    (2006.01)
(Continued)

(52) U.S. Cl.
CPC .............. *G01D 5/40* (2013.01); *G02B 5/208* (2013.01); *G02B 5/223* (2013.01);
(Continued)

(58) Field of Classification Search
CPC ...... G02B 5/208; G02B 5/223; G02B 6/4246; G02B 6/4249; G02B 6/4204;
(Continued)

(56) References Cited

U.S. PATENT DOCUMENTS

| | | | |
|---|---|---|---|
| 5,187,361 A | 2/1993 | Ishii | |
| 5,399,441 A * | 3/1995 | Bearinger | ........... C04B 41/5035 257/E21.271 |

(Continued)

FOREIGN PATENT DOCUMENTS

WO    2013/091829    6/2013

OTHER PUBLICATIONS

Australian Patent Office, International Search Report and Written Opinion, issued by ISA/AU in International Patent Application No. PCT/SG2013/000380 (Nov. 5, 2013).

*Primary Examiner* — Kara E Geisel
*Assistant Examiner* — Maurice Smith
(74) *Attorney, Agent, or Firm* — Fish & Richardson P.C.

(57)    ABSTRACT

An opto-electronic sensor module (e.g., an optical proximity sensor module) includes a substrate, a light emitter mounted on a first surface of the substrate, the light emitter being operable to emit light at a first wavelength, and a light detector mounted on the first surface of the substrate, the light detector being operable to detect light at the first wavelength. The module includes an optics member disposed substantially parallel to the substrate, and a separation member disposed between the substrate and the optics member. The separation member may surround the light emitter and the light detector, and may include a wall portion that extends from the substrate to the optics member and that separates the light emitter and the light detector from one another. The separation member may be composed, for example, a thermosetting polymer material, a UV-curing (Continued)

polymer material or a visible light-curing polymer material, wherein the separation member further includes one or more inorganic fillers and/or dyes that make the separation member substantially non-transparent to light detectable by the light detector and/or emitted by the light emitter.

19 Claims, 4 Drawing Sheets

(51) Int. Cl.
  *G02B 5/22*     (2006.01)
  *H01L 27/146*    (2006.01)
  *G02B 5/20*     (2006.01)
  *G03B 7/099*    (2014.01)
  *G02B 6/42*     (2006.01)

(52) U.S. Cl.
  CPC .. *H01L 27/14625* (2013.01); *H01L 27/14678* (2013.01); *G02B 6/4204* (2013.01); *G02B 6/4246* (2013.01); *G02B 6/4249* (2013.01); *G03B 7/099* (2013.01); *H01L 2924/0002* (2013.01)

(58) Field of Classification Search
  CPC ... H01L 27/14625; G01C 3/00; G01B 11/026; G01N 2201/0642
  See application file for complete search history.

(56) References Cited

U.S. PATENT DOCUMENTS

| | | | |
|---|---|---|---|
| 6,381,072 B1* | 4/2002 | Burger | G02B 3/0056 359/621 |
| 7,663,083 B2 | 2/2010 | Kwon et al. | |
| 7,826,039 B2* | 11/2010 | Hinderling | G01C 3/00 356/4.01 |
| 7,925,154 B2 | 4/2011 | Ryu | |
| 8,475,061 B2 | 7/2013 | Linnen et al. | |
| 8,558,161 B2 | 10/2013 | Ong et al. | |
| 8,674,305 B2 | 3/2014 | Rossi et al. | |
| 8,975,108 B2 | 3/2015 | Rudmann et al. | |
| 2002/0154366 A1 | 10/2002 | Horio | |
| 2002/0178517 A1* | 12/2002 | Kasada | C09B 23/06 8/644 |
| 2003/0010431 A1* | 1/2003 | Feldman | G02B 6/4214 156/250 |
| 2004/0165252 A1 | 8/2004 | Liang et al. | |
| 2007/0277927 A1 | 12/2007 | Momose | |
| 2008/0049210 A1* | 2/2008 | Takaoka | G01B 11/026 356/3 |
| 2008/0290435 A1 | 11/2008 | Oliver et al. | |
| 2009/0067055 A1 | 3/2009 | Yamamura | |
| 2009/0159900 A1 | 6/2009 | Basoor et al. | |
| 2010/0045963 A1* | 2/2010 | Yamaguchi | G01B 11/026 356/4.01 |
| 2010/0230694 A1 | 9/2010 | Arndt et al. | |
| 2010/0258712 A1 | 10/2010 | Wiese | |
| 2010/0327164 A1 | 12/2010 | Costello et al. | |
| 2011/0013292 A1* | 1/2011 | Rossi | H01L 27/14621 359/738 |
| 2011/0031510 A1 | 2/2011 | Rossi et al. | |
| 2011/0032409 A1* | 2/2011 | Rossi | G02B 5/005 348/340 |
| 2011/0050979 A1* | 3/2011 | Rudmann | H01L 27/14623 348/335 |
| 2011/0057104 A1 | 3/2011 | Yao et al. | |
| 2011/0121181 A1 | 5/2011 | Costello et al. | |
| 2011/0133941 A1 | 6/2011 | Yao et al. | |
| 2011/0176214 A1* | 7/2011 | Eiane | F41G 7/226 359/601 |
| 2011/0248152 A1 | 10/2011 | Svajda | |
| 2012/0037793 A1 | 2/2012 | Ong et al. | |
| 2013/0019461 A1 | 1/2013 | Rudmann et al. | |
| 2013/0075595 A1 | 3/2013 | Ruh | |

* cited by examiner

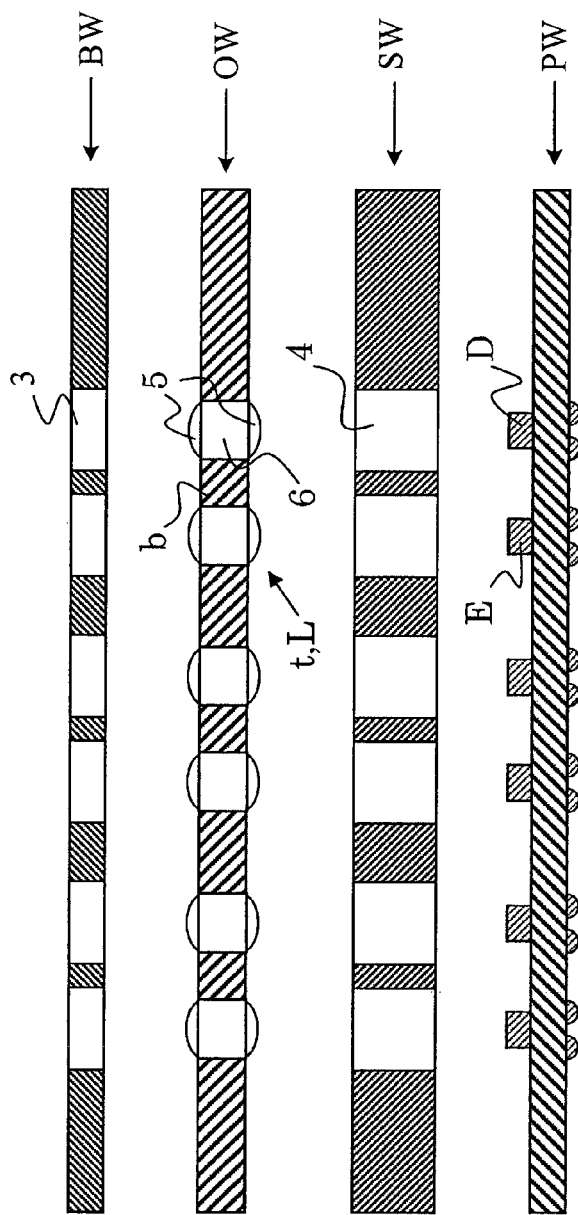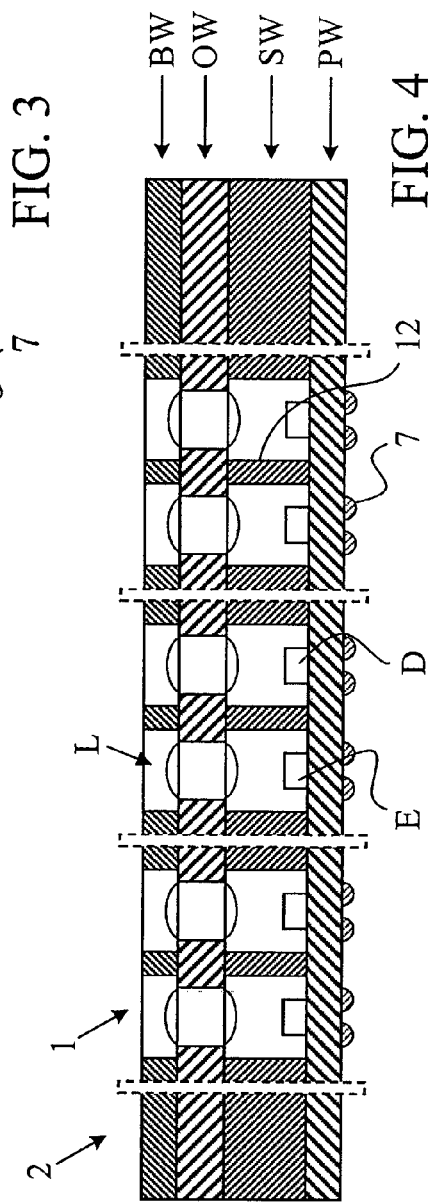

OPTO-ELECTRONIC MODULE INCLUDING A NON-TRANSPARENT SEPARATION MEMBER BETWEEN A LIGHT EMITTING ELEMENT AND A LIGHT DETECTING ELEMENT

TECHNICAL FIELD

This disclosure relates to opto-electronic modules such as optical proximity sensor modules.

BACKGROUND

Proximity sensors are used to detect the position or location of an object. Various types of proximity sensors are available, including optical, inductive and capacitive sensors.

Optical proximity sensors can employ reflective techniques, for example, to detect the presence or absence of an object in the vicinity of the sensor. A typical technique is to use a light emitting diode (LED) and an optical detector configured in such a way that light emitted from the LED is reflected from an object back to the detector. The light source can be selected so that the light is suitable for detection by the light detector. Thus, for example, the light source can generate light of a frequency that the light detector is best able to detect and that is not likely to be generated by other nearby sources.

In designing small optical proximity, issues of electrical interference, optical crosstalk, and signal-to-noise ratio often need to be addressed. For example, there are various potential sources of optical interference in an optical proximity sensor: external (e.g., sunlight, indoor lighting, unintended targets) and internal (e.g., optical crosstalk between the subcomponents of the proximity sensor). External interference sometimes can be suppressed or reduced as part of signal processing. Internal interference, on the other hand, can be more challenging to manage, particularly in applications where the proximity sensor is mounted behind a transparent or semi-transparent cover such that the intensity of the light reflected from the cover may be similar in magnitude to the signal of interest.

SUMMARY

Opto-electronic modules are disclosed that, in some implementations, can help reduce optical interference and crosstalk, and can improve signal-to-noise ratio.

For example, in one aspect, an opto-electronic module (e.g., an optical proximity sensor module) includes a substrate, a light emitter mounted on a first surface of the substrate, the light emitter being operable to emit light at a first wavelength, and a light detector mounted on the first surface of the substrate, the light detector being operable to detect light at the first wavelength. The module can include an optics member disposed substantially parallel to the substrate, and a separation member, wherein the separation member is disposed between the substrate and the optics member.

In some implementations, the separation member surrounds the light emitter and the light detector, and can include a wall portion that extends from the substrate to the optics member and that separates the light emitter and the light detector from one another. Preferably, the separation member is substantially non-transparent (i.e., opaque) to light emitted by the light emitter and/or light detectable by the light detector. The separation member can be composed, for example, of a thermosetting polymer material, a UV-curing polymer material or a visible light-curing polymer material, wherein the separation member further includes one or more pigments, inorganic fillers and/or dyes that make the separation member substantially non-transparent to light detectable by the light detector and/or emitted by the light emitter.

The disclosure also describes a method of fabricating a plurality of opto-electronic sensor modules.

In addition, a mobile communication device is disclosed and includes an opto-electronic sensor module such as those described above or in greater detail below.

The details of one or more implementations are set forth in the accompanying drawings and the description below. Other aspects, features, and advantages will be apparent from the description and drawings, and from the claims.

BRIEF DESCRIPTION OF DRAWINGS

FIG. 3 is a cross-sectional view of wafers for forming a wafer stack for manufacturing multiple modules as shown in of FIG. 1.

FIG. 4 is a cross-sectional view of a wafer stack for manufacturing multiple modules of FIG. 1.

DETAILED DESCRIPTION

Figure 1:
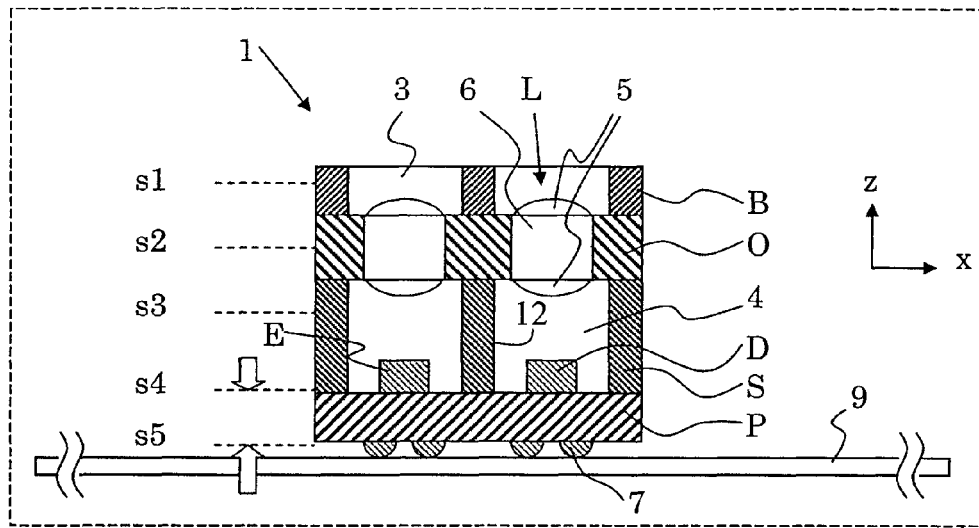
FIG. 1 is a cross-sectional view of an opto-electronic module.
Figure 2:
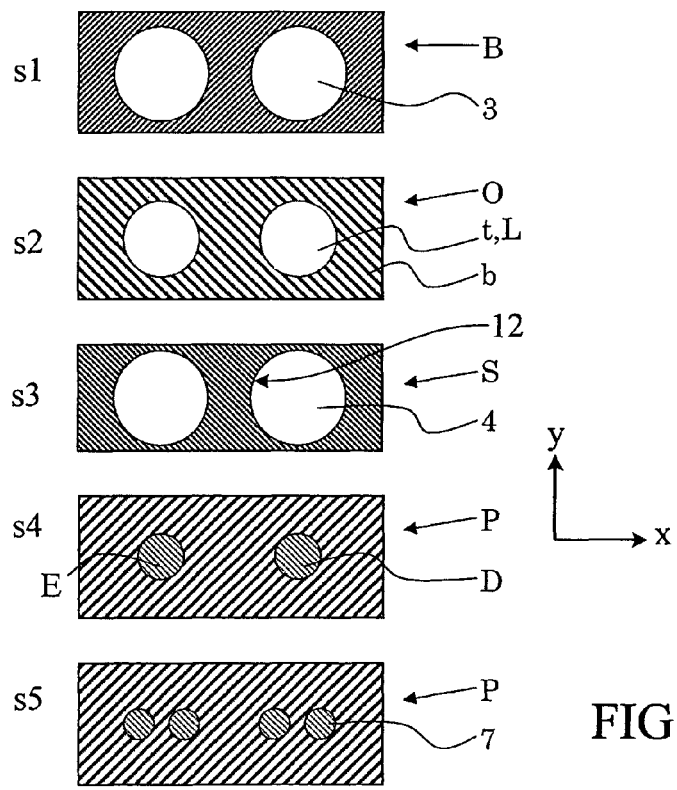
FIG. 2 shows various cross-sectional views of constituents of the module of FIG. 1.

As illustrated in FIG. 1, an opto-electronic module 1 can include at least one active optical component and at least one passive optical component. Examples of an active optical component include a light sensing or a light emitting component, such as a photodiode, an image sensor, an LED, an OLED or a laser chip. Examples of a passive optical component include an optical component that redirects light by refraction and/or diffraction and/or reflection such as a lens, a prism, a mirror or an optical system (e.g., a collection of passive optical components that may include mechanical elements such as aperture stops, image screens or holders). FIG. 2 shows various lateral schematic cross-sectional views of constituents of the module of FIG. 1, wherein the approximate positions of these lateral cross-sections are indicated in FIG. 1 by s1 to s5 and dashed lines. For s4 and s5, the direction of view is indicated by arrows.

Module 1 includes several constituents (P, S, O, B) stacked upon each other in the vertical direction (i.e., the z direction in FIG. 1). Directions in the x-y plane (cf., FIG. 2) that are perpendicular to the vertical (z) direction may be referred to as lateral directions.

Module 1 includes a substrate P, a separation member S, an optics member O and a baffle member B stacked upon each other. Substrate P is, for example, a printed circuit board assembly. The printed circuit board (PCB) of the PCB assembly may be referred to as an interposer. On the PCB there is mounted an emission member E for emitting light (e.g., an optical transmitter die including, for example, a light-emitting diode for emitting infrared light or near-infrared light) and a detecting member D (e.g., an optical receiver die including, for example, a photo diode for detecting infrared light or near-infrared light) for detecting light at the frequency/wavelength (or range of frequencies/wavelengths) emitted by the emission member E. In general, light refers to electromagnetic radiation and, can include, for example, electromagnetic radiation in the infrared, visible or ultraviolet portion of the electromagnetic spectrum.

Electrical contacts of emission member E and detecting member D are connected electrically to outside module 1, where solder balls 7 are attached. Some implementations include four electrical contacts: two for the emission member E and two for the detecting member D. Instead of providing solder balls 7, some implementations include contact pads on the PCB which may be provided with solder balls at a later time. Module 1 thus can be mounted on a printed circuit board 9, e.g., using surface mount technology (SMT), next to other electronic components. Printed circuit board 9 may be a constituent of an electronic device 10 such as a hand-held communication device. For example, device 10 can be a smart phone or other mobile phone. Module 1 is particularly suitable for such applications because it can be manufactured to have a particularly small size.

Separation member S has two openings 4, with emission member E arranged in one of them and detecting member D being arranged in the other. This way, emission member E and detecting member D are laterally encircled by separating member S. Although the openings are shown as substantially circular, they may have other shapes in some implementations.

Separation member S may fulfill several tasks. It can ensure a well-defined distance between substrate P and optics member O (through its vertical extension) which helps to achieve well-defined light paths from emitting member E through optics member O and from the outside of module 1 through optics member O onto detecting member D. Separation member S can also provide protection of detecting member D from light that is not supposed to be detected by detection member D, by being substantially non-transparent to light generally detectable by detecting member D and by forming a portion of the outside walls of module 1. Separation member S also can provide protection of detecting member D from light emitted by emitting member E which should not reach detecting member D, so as to reduce optical cross-talk between emission member E and detecting member D, by being substantially non-transparent to light generally detectable by detecting member D and by forming a wall between emission member E and detecting member D. Light reflected inside module 1 and stray light originating from emission member E can be prevented from reaching detecting member D this way.

In some implementations, separating member S is made of a non-transparent (i.e., opaque) polymer material. For example, the separating member S can be composed of a hardenable (e.g., curable) polymer material such as a thermosetting polymer, a UV-curing polymer or a visible light-curing polymer with one or more pigments, inorganic fillers and/or dyes to make the resulting material substantially non-transparent at the wavelength(s) of interest. Examples of polymer materials that are suitable in some implementations include: epoxy resins, acrylic resins (e.g., acrylates, methacrylates, urethane acrylates, or cyanoacrylates), polyurethane and urethane resins, silicone resins, organic-inorganic hybrid polymers (organosilane compositions), polyimides, polycarbaminacid derivatives, polyester resins, phenolic resins, vinyl ester resins, polyamide resins, polyamide-imides, phenol-formaldehyde resins, urea-formaldehydes, melamine formaldehyde resins, cyanate esters, resorcinol or phenol-resorcinol formaldehyde, polybenzimidazole, acrylate acid diester, hybrid materials (e.g., epoxy-phenolic, epoxy-polysulfide, epoxy-nylon, nitrilephenolic, neoprene-phenolic or vinyl-phenolic resins).

As mentioned above, the polymer for the separation member S can be made non-transparent to the wavelength(s) in interest by adding one or more pigments, inorganic fillers and/or dyes. Examples of suitable pigments include carbon black as well as pigments that are targeted to a particular wavelength or range of wavelengths. Likewise, suitable inorganic fillers include various micro-particles and nano-particles (e.g., graphite, graphene, silicon, metals, and non-transparent minerals such as opaque oxides). If a dye is added to the polymer to achieve the desired non-transparency, the dye should have a high absorption in the wavelength range of interest. Examples of dyes that that can be added to the polymer so as to absorb infra-red light include polymethine cyanine dyes.

In some implementations, the separation member S is provided with a coating of non-transparent material such as black photoresist, thin metal and/or metal oxide layer. Furthermore, in some implementations, additional inorganic filler materials (e.g., quartz or glass particles; mineral fillers) can be added to the polymer to improve the mechanical or thermal properties of the separation member S.

To achieve maximum sensitivity and detection range, a close distance between emission member (e.g., LED) E and detecting member (e.g., photodiode) D can be important. However, in order to avoid erroneous sensor response and a reduced dynamic range due to internal crosstalk, the emitter situated close to the receiver requires an IR-effective optical insulation by a separating wall or cover. The separating member S has a vertical wall dividing portion 12 that separates the emission member E and detecting member D from one another, which can help reduce internal optical crosstalk.

Optics member O includes a blocking portion b and two transparent portions t, one for allowing light emitted by emission member E to leave module 1, and another one for allowing light to enter module 1 from the outside of module 1 and reach detecting member D.

Blocking portion b is substantially non-transparent for light generally detectable by detecting member D, e.g., by being made of a suitable (polymer) material. Transparent portions t comprise a passive optical component L or, more particularly and as an example, a lens member L each, for light guidance. Lens members L may, e.g., comprise, as shown in FIG. 1, two lens elements 5 in close contact to a transparent element 6. Transparent elements 6 can have the same vertical dimension as optics member O where it forms blocking portion b, such that optics member O where it forms blocking portion b together with transparent elements 6 describes a (close-to-perfect) solid plate shape. Lens elements 5 (see FIG. 1) redirect light by refraction and/or by diffraction. For example, the lens elements may all be of generally convex shape (as shown in FIG. 1), but one or more of lens elements 5 may be differently shaped, e.g., generally or partially concave.

Baffle member B can provides shielding of undesired light, in particular light leaving module 1 or incident to module 1 in an desired angle. Baffle member B may have two separate transparent regions 3 which may be formed as openings or by means of transparent material. Outside the transparent regions 3, baffle member B can be made of a material substantially attenuating or blocking light generally detectable by the detecting members, or it can be provided with a coating having such a property, although the latter may be more complex to manufacture. The shape of baffle member B, or more precisely the shape of the transparent regions 3, can differ from what is shown in FIGS. 1 and 2 (e.g., cone-like shapes or a truncated pyramid).

The lateral shape not only of the transparent regions 3, but also of the transparent portions t and of the openings 4 do not have to be circular, but may have other shapes, e.g., polygonal or rectangular with rounded corners.

Module 1 is a packaged opto-electronic component. The vertical side walls of module 1 are formed by items P, S, O and B. A bottom wall is formed by substrate P, and a top wall by baffle member B or by baffle member B together with optics member O.

As is visible in FIG. 2, each of the four items P, S, O, B, which also may be referred to as housing components, has substantially the same lateral shape and lateral dimensions as the other housing components. This facilitates a very efficient way of manufacturing such modules 1 as is described in more detail below referring to FIGS. 3 and 4. Each of the housing components P, S, O and B has a generally block- or plate-like shape or, more generally, a rectangular parallelepiped shape, possibly having holes or openings (such as baffle member B and separation member S do) or projections (such as optics member O does).

In some implementations, the module 1 is a proximity sensor. Such a module 1 can allow detection of whether or not an object is located within a predefined distance from the module, e.g., as judged from a photocurrent generated by detecting member D, while emission member E is emitting light, e.g., in the form of light pulses. For example, emission member E, optics member O and detecting member D can be arranged such, that a surface capable of reflecting light located within a predefined distance or distance range of optics member O enables detection by detecting member D of a sufficiently high intensity of light emitted by emission member E and reflected by the surface, whereas light emitted by emission member E and reflected by such a surface located farther away from optics member O and outside said predefined distance, respectively, would not cause detection of a sufficiently high light intensity by detecting member D.

Furthermore, it is possible to provide modules which are designed according to the same principles as discussed above, but comprising, in addition to detecting member D, one or more additional electronic components such as additional light detectors, or one or more integrated circuits, or two or more light sources.

The active electronic components (such as emission member E and detecting member D in the example of FIG. 1) in module 1 can be packaged or unpackaged electronic components. For contacting substrate P, technologies such as wire-bonding or flip chip technology or any other known surface mount technologies may be used, as can conventional through-hole technology.

FIG. 3 shows a schematic cross-sectional view of wafers for forming a wafer stack for manufacturing multiple modules as shown in FIG. 1. Generally, a wafer refers to a substantially disk- or plate-like shaped item, its extension in one direction (z-direction or vertical direction) is small with respect to its extension in the other two directions (x- and y-directions or lateral directions). On a (non-blank) wafer, a plurality of similar structures or items can be arranged, or provided therein, for example, on a rectangular grid. A wafer can have openings or holes, and in some cases a wafer may be free of material in a predominant portion of its lateral area. Depending on the implementation, a wafer may be made, for example, of a semiconductor material, a polymer material, a composite material comprising metals and polymers or polymers and glass materials. In particular, the wafers may comprise hardenable materials such as a thermally or UV-curable polymers. In some implementations, the diameter of a wafer is between 5 cm and 40 cm, and can be, for example between 10 cm and 31 cm. The wafer may be cylindrical with a diameter, for example, of 2, 4, 6, 8 or 12 inches, one inch being about 2.54 cm. The wafer thickness can be, for example, between 0.2 mm and 10 mm, and in some cases, is between 0.4 mm and 6 mm.

Although FIGS. 3 and 4 only show provisions for three modules 1, in some implementations there can be, in one wafer stack, provisions for at least ten modules in each lateral direction, and in some cases at least thirty or even fifty or more modules in each lateral direction. Examples of the dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

In some implementations, four wafers can be used to create a wafer stack for manufacturing multiple modules as shown in FIG. 1. As shown in FIG. 4, the stack includes a substrate wafer PW, a spacer wafer SW, an optics wafer OW and a baffle wafer BW. Each wafer comprises a multitude of the corresponding members comprised in the corresponding module 1 (cf. FIGS. 1 and 2), arranged for example on a rectangular lattice, with a little distance from each other to facilitate a subsequent separation step.

Substrate wafer PW can be, for example, a PCB assembly comprising a PCB of standard PCB materials, provided with solder balls 7 on the one side and with active optical components (e.g., members E and D) soldered to the other side. The latter can be placed on substrate wafer PW, for example, by pick-and-place using standard pick-and-place machines.

The spacer wafer SW can help maintain the substrate wafer PW and the optics wafer OW at substantially a constant distance from one another. Thus, incorporating the spacer wafer SW into the wafer stack can enable higher imaging performance and complexity. The stacked wafer subsequently can be diced into individual micro-optics structures, resulting in multiple (e.g., thousands) of structures per wafer.

In order to provide maximum protection from detecting undesired light, each of the wafers PW, SW, OW, BW can be made substantially of a material that is substantially non-transparent for light detectable by detecting members D, except for transparent areas such as transparent portions t and transparent regions 3.

For example, in some implementations, the spacer wafer SW is made of a UV- or thermally-curing epoxy (or other polymer) containing carbon black (or other dark pigment) or an inorganic filler or a dye. In some implementations, the additive is embedded in the epoxy (or other polymer). The amount of carbon black, inorganic filler or dye in the epoxy or other polymer material may depend on the particular application and may depend, for example, on the desired or required optical characteristics of the spacer wafer SW. Thus, in some implementations, to reduce optical cross-talk or detection of other undesirable light by the detecting member D, the spacer wafer SW can be made of a UV or thermally curing epoxy or other polymer material containing at least 0.7% carbon black or inorganic filler or dye, although in some implementations a lower amount of carbon black or inorganic filler or dye can be sufficient. The optimal or desired percentage of carbon black or inorganic filler or dye in the epoxy or other polymer material for the spacer wafer SW may be adjusted, for example, depending on the lateral thickness of the wall 12.

For example, in some implementations, the wall thickness is about 200 µm, and the epoxy or other polymer material contains about at least 0.8% carbon black or inorganic filler or dye. For light having a wavelength of 800 nm, the foregoing compositions can result in an absorption coefficient ($\alpha$) of about 0.0295/µm. In general, the transmission $T=10^{-\alpha*d}$ for a wall portion 12 having a thickness d. Thus, in the foregoing example, the transmission (T) through the wall portion 12 is less than 0.00015%, which corresponds to an absorbance, or optical density, of about 5.8, where the absorbance represents a logarithmic ratio of the amount of radiation falling on a material to the amount of radiation transmitted through the material. In some applications, the amount of carbon black or inorganic filler or dye is sufficiently high such that the transmission (T) of light through the wall portion 12 at the wavelength of light emitted by the emission member E is no greater than 0.1%. Likewise, in some applications, the amount of carbon black or inorganic filler or dye is sufficiently high such that the absorbance, or optical density, of the wall portion 12 at the wavelength of light emitted by the emission member E is at least 3. In some implementations, the separation member S has an absorption coefficient ($\alpha$) of at least 0.015/µm at the wavelength of light emitted by the light emitter for a thickness of about 200 µm for the wall 12.

As already mentioned, various polymer materials (e.g., epoxy resin, acrylate, polyurethane, or silicone materials) can be used as the base material for the spacer wafer SW, with the addition of one or more pigments or other adhesives to reduce the optical transmission characteristics of the spacer wafer at the wavelength(s) of interest (i.e., the wavelength(s) of light emitted by the LED or other emission member E). Examples of base materials for the spacer wafer SW include one or more of the following: EMCAST™ (e.g., 23xx, 24xx, 25xx and 2600 series), available from Electronic Materials, Inc.; MASTERBOND™ (e.g., UV15-7DC, UV1ODCTK) available from Master Bond Inc.; DELO-DUALBOND™ (e.g., AD VE 80342) available from DELO Industrial Adhesives; AC A1449, available from Addison Clear Wave; EPOTEK OG198-54, available from Epoxy Technology, Inc.; and LOCTITE 334, 392, 5091. Some of the foregoing materials are dual-curing (i.e., can be cured by UV light as well as thermally). Carbon black (or other pigments) or an inorganic filler or a dye can be added to the base material to reduce the optical transmission characteristics of the spacer wafer SW at the wavelength(s) of interest. For example, carbon black (or another pigment) or an inorganic filler or a dye can be added to the base polymer material in an amount that is sufficiently high such that the transmission (T) of light through the wall portion 12 at the wavelength of light emitted by the emission member E is no greater than 0.1%. Likewise, in some applications, the amount of the pigment or inorganic filler or dye is sufficiently high such that the absorbance, or optical density, of the wall portion 12 at the wavelength of light emitted by the emission member E is at least 3.

The spacer wafers SW and baffle wafer BW, as well as at least a portion of optics wafer OW, can be fabricated, for example, by replication. Replication refers to a technique by means of which a given structure or a negative thereof is reproduced, e.g., etching, embossing, molding or vacuum injection. In a particular example of a replication process, a structured surface is embossed into a liquid, viscous or plastically deformable material, then the material is hardened, e.g., by curing using ultraviolet radiation or heating, and then the structured surface is removed. Thus, a replica (which in this case is a negative replica) of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state.

The wafer-level replication process thus can be implemented, for example, by precisely dispensing droplets of application-specific liquid polymer onto a wafer. The polymer then is embossed with a mold and cured on the wafer using ultraviolet light to harden it. The wafer then is separated from the mold. This process can be repeated on the other side of the wafer with micro-meter alignment accuracy. In some implementations, the replication material can be confined between a tool and the surface of the substrate as described in U.S. Pat. No. 7,704,418, which is incorporated by reference herein.

Suitable replication techniques for fabricating the spacer wafer SW are disclosed, for example, in U.S. Published Patent Application No. 2011/0039048 A1 and in U.S. Provisional Application No. 61/746,347, both of which are incorporated herein by reference. The spacer wafer SW can be fabricated such that its thickness at the edges exceeds the thickness of the spacer wafer at surface locations around the edges. In this way, the edges are elevated with regard to the average thickness of the spacer. For example, if the spacer wafer SW itself typically has a thickness of 100 to 1500 microns (µm), the elevation of the edges with regard to the surrounding surface may be around 1-10 µm.

In some implementations, the replicated elements (e.g. spacer wafer SW, optics wafer OW, and substrate wafer PW) that pass through the wafer-level curing process are thermally stable and can withstand heat processes, such as reflow processes, where temperatures can reach, for example, up to about 260° C. Thermally stable elements substantially retain their general shape and do not decompose at relatively high operating temperatures. This characteristic of the replicated elements is generally referred to as "reflowability." The materials used to fabricate the thermally stable elements can include, for example, thermosetting polymers or thermoplastic polymers.

Such fabrication techniques facilitate the modules being incorporated, for example, into mobile phones or other electronics products because the modules can be directly integrated into the assembly line process. In some implementations, the reflowable elements satisfy GR-468 CORE environmental tests including thermal cycling of 1000 times between −40° C. and +85° C., and 1000 hours at +85° C. temperature and 85% relative humidity.

For example, as noted above, the spacer wafer SW can be a thermally-curing epoxy, formed from an epoxy resin and hardener, which in some implementations also contains carbon black (or other pigment) or an inorganic filler or a dye. The thermal stability of such epoxy compounds depends primarily on the chemical structure of the epoxy resin and on the type of hardener. For instance, for thermoplastic epoxy compounds, the glass transition temperatures of an epoxy compound can vary within the range of about 100 to about 270° C.

The replicated elements also can be formed from thermally stable, ultraviolet (UV)-curable epoxies or other polymer materials. In some implementations, the replicated elements can be formed using materials that are "dual-curable." That is, the materials can be cured using either heat (thermally curable) or ultraviolet light (UV-curable), depending on which of the two curing methods is employed. Examples of materials that can be used for thermally stable curable polymers include one or more of the following: EMCAST™ (e.g., 23xx, 24xx, 25xx and 2600 series), available from Electronic Materials, Inc.; MASTER-BOND™ epoxies (e.g., UV15-7DC and UV1ODCTK) available from Master Bond Inc.; DELO-DUALBOND™ (e.g., AD VE 80342) material available from DELO Industrial Adhesives; AC A1449, available from Addison Clear Wave; EPOTEK OG198-54 epoxy, available from Epoxy Technology, Inc.; and/or LOCTITE 334, 392, and 5091 series materials.

Examples of other materials include epoxies having functional amino silanes and a copolymer of aminopropylmethyl dimethyl siloxane in definite ratios. The use of silicon compounds in curable epoxies can, in some implementations, enhance the thermal stability, chemical resistance and corrosion resistance of the epoxy, whereas the use of silane bearing trimethoxy groups may provide better adhesion properties.

Alternatively, or in addition, the thermal stability of curable epoxies or other polymers can be enhanced by using ring compounds as curing agents. For example, the thermal stability of epoxy resins made from bisphenol A can be enhanced by using aromatic amines and anhydrides, novolaks, bismaleimides (e.g., di-(p-maleimidophenyl) methane), and imidazole derivatives, among others. Additional resin and curing agent combinations can be used to enhance thermal stability as well.

The materials for the lenses L also can be made of suitable reflowable material, in which the reflowable material is transparent for light detectable by a detecting member D. Similar to the spacer wafer elements, suitable material for lenses L can include, for example, hardenable (e.g., curable) polymer materials or materials that are transformed in a hardening (e.g., curing) step from a liquid, viscous or plastically deformable state into a solid state. In some implementations, curing of the lens material is achieved through the application of heat, UV light or a chemical additive to the polymer material. The same polymer materials used to fabricate the spacer wafer SW, the optics wafer OW, or the substrate wafer PW (with the exception of carbon black, the inorganic filler or the dye) can be used as the lens material. Other polymer materials that can be used to form the lenses L include, for example, one or more of the following: THREEBOND™ 3078A, 3078B, or 3078C series epoxies, available from ThreeBond Co., Ltd.; DELO-KATIOBOND™ AD VE 18499 epoxy and DELO-PHOTOBOND™ epoxy (e.g., GB368 and 19923 series), each of which is available from DELO Industrial Adhesives; EPOTEK™ epoxies (e.g., 90-172-4, 90-174-3, 100-24-3, or OG142-13 series epoxies); Kyoritsu XLM-C5 or XRC 9-2 series epoxies, available from Kyoritsu Chemical & Co., Ltd.; MRT Ormocomp™ US-S4 epoxy, available from Micro Resist Technology GmbH; Showa Denko™ SAS008L-P epoxy, available from Showa Denko K.K.; and/or WELLOMER™ epoxy DUV 764 epoxy, available from Wellomer Adhesive Technology.

For the optics wafer OW, replication or molding may be used for obtaining the non-transparent portions (e.g., blocking portions b). It also is possible to provide holes, where transparent portions t are supposed to be, by drilling or by etching. Subsequently, a so-obtained precursor wafer is provided with lens members L, so as to yield optics wafer OW. This may be accomplished by means of replication, e.g., forming lens members L as unitary parts. The lens members L, however, also can be manufactured starting from a semi-finished part being a wafer comprising transparent elements 6 within holes by which transparent regions 3 are defined. This can be particularly useful when each of the lens members L describes at least one apex, and those apices are located outside a vertical cross-section of the optics wafer OW. Such a semi-finished part is can be a flat disk-like wafer having no holes penetrating the wafer in the transparent regions 3 and having virtually no or only shallow surface corrugations, such surface corrugations usually being concave, i.e. not extending beyond the wafer surface as described by the blocking portions b.

A semi-finished part like that can be obtained starting from a flat precursor wafer (typically made of one material) having holes or openings where the transparent portions are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, for example, using a squeegee process (e.g., as known from screen printing) or a dispenser with several hollow needles outputting material. During the dispensing, the wafer can be placed on a flat support plate, e.g., made of a silicone. Care should be taken to prevent the formation of air bubbles or cavities in the dispensed material, because this would degrade the optical properties of the lens members L to be produced. For example, one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain a transparent element 6 having parallel surfaces adjusted to the wafer thickness. Then, by means of replication, lens elements 5 are applied to one or both sides (top and button sides) of wafer OW. In case of concave meniscuses of the transparent elements, the replication can take place on these, wherein the amount of applied replication material may be adjusted accordingly.

Figure 5:
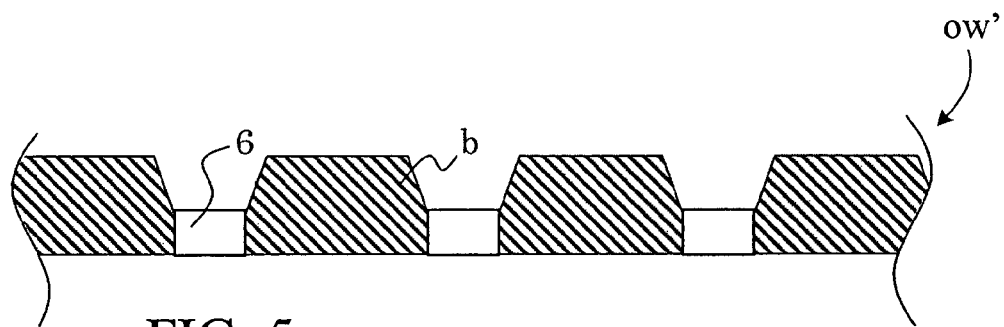
FIG. 5 is a cross-sectional view of a semi-finished part having a structured surface.

It is possible to provide a combined optics wafer which incorporates the features and functionalities of the optics wafer OW as well as the spacer wafer SW and/or the baffle wafer BW. Producing such a combined optics wafer can be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements to be provided in precursor wafer and present in the semi-finished part, respectively. In FIG. 5, an example of a semi-finished part ow' with one structured surface is schematically illustrated. The semi-finished part can be used for manufacturing a module shown in FIG. 1. By considering wafers OW and SW (or wafers OW and BW, or wafers OW and SW and BW) in FIG. 4 as one single part, a combined optics wafer is provided for manufacturing a module according to FIG. 1.

In order to form a wafer stack 2, the wafers are aligned and bonded together, for example, by gluing, e.g., using a heat-curable and/or UV-curable epoxy resin. Each active optical component (such as detecting members D and emission members E on the substrate wafer PW) should be sufficiently accurately aligned with a corresponding passive optical component (such as lens members L of the optics wafer OW). In some implementations, a hole may be formed in the substrate wafer PW, in which the hole extends through a thickness of the substrate wafer PW, to provide venting during the reflow process in order to release pressure build-up. The hole can be formed in the substrate wafer PW through drilling or an etching process.

FIG. 4 shows a cross-sectional view of a wafer stack 2 for manufacturing multiple modules 1 as shown in FIG. 1. The thin dashed rectangles indicate where separation takes place, e.g., by means of using a dicing saw.

The fact that most of the alignment steps are carried out on the wafer level makes it possible to achieve good alignment (in particular of members D and E with respect to members L) in a relatively simple and fast way. The overall manufacturing process can, therefore, be very fast and precise. Due to the wafer-scale manufacturing, only a small number of production steps is required for manufacturing multiple modules 1.

As noted above, in some implementations, module 1 is a proximity sensor module. The techniques described above allow multiple modules to be fabricated at the same time using a wafer-level manufacturing process. The packaged module 1 can be incorporated into and operably connected to a wide range of devices, such as a portable electronic device, a hand-held portable electronic device, a personal computing device, a camera, an audio or video playback device, a laptop computer, or a personal digital assistant.

Figure 6:
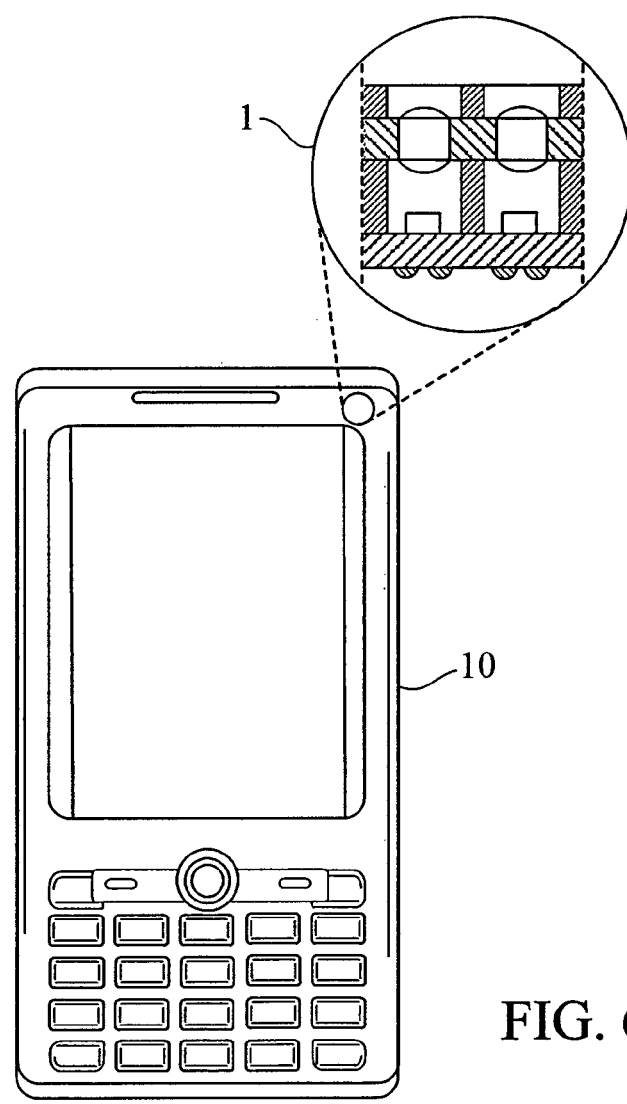
FIG. 6 illustrates an example of a mobile phone with an optical proximity sensor.
Figure 7:
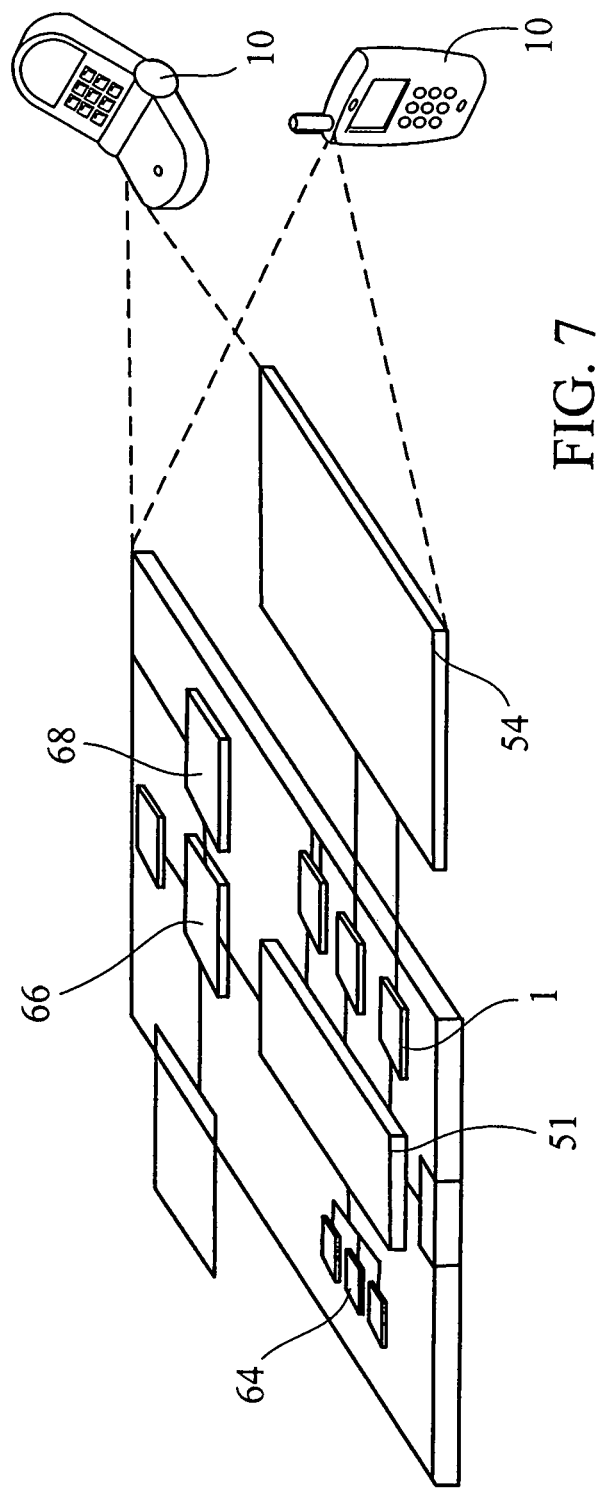
FIG. 7 illustrates further details of a mobile phone.

A particular example of an application for the proximity sensor module 1 is in a mobile phone 10 (see FIG. 6). For example, the proximity sensor module 1 can be used to detect that a mobile phone is next to the user's ear or face so that the phone's display can be dimmed or deactivated automatically when the display is not being used, thereby extending the life of the phone's battery. As shown in FIG. 7 some implementations of the mobile phone 10 include a processor 52, memory 64, an input/output device such as a display 54, a communication interface 66, and a transceiver 68, among other components. The various components can be interconnected using various buses, and several of the components may be mounted on a common motherboard or in other manners as appropriate. The proximity sensor module 1 also can be interconnected to other components in the device 10 and, in some implementations, can be mounted on the common motherboard with some of the other components.

A number of implementations have been described. Nevertheless, it will be understood that various modifications may be made without departing from the spirit and scope of the invention. Accordingly, other implementations are within the scope of the claims.

What is claimed is:

1. An opto-electronic sensor module comprising:
a substrate;
a light emitter mounted on a first surface of the substrate, the light emitter operable to emit light at a first wavelength;
a light detector mounted on the first surface of the substrate, the light detector operable to detect light at the first wavelength;
an optics member disposed substantially parallel to the substrate, wherein the optics member comprises first and second transparent portions that are transparent to light at the first wavelength, the optics member further comprising a blocking portion that substantially attenuates or blocks incident light at the first wavelength, and wherein the first transparent portion is disposed above the light emitter and the second transparent portion is disposed above the light detector; and
a separation member that is disposed between the substrate and the optics member, surrounds the light emitter and the light detector, includes a wall portion that extends from the substrate to the optics member and that separates the light emitter and the light detector from one another, and is composed of a thermosetting polymer material, a UV-curing polymer material or a visible light-curing polymer material, wherein the separation member further includes one or more inorganic fillers that make the separation member substantially non-transparent to light detectable by the light detector.

2. The opto-electronic sensor module of claim 1 wherein the light emitter comprises a light-emitting diode and the light detector comprises a photodiode.

3. The opto-electronic sensor module of claim 2 wherein the light-emitting diode emits infrared light or near-infrared light and the photodiode detects infrared light or near-infrared light.

4. The opto-electronic sensor module of claim 1 wherein the separation member is substantially non-transparent to light emitted by the light emitter.

5. The optical sensor module of claim 1 wherein transmission of light through the wall portion at a wavelength of light emitted by the light emitter is no greater than 0.1%.

6. The optical sensor module of claim 1 wherein transmission of light through the wall portion at a wavelength of light emitted by the light emitter is no greater than 0.00015%.

7. The optical sensor module of claim 1 wherein absorbance of light in the wall portion at a wavelength of light emitted by the light emitter is at least 3.

8. The opto-electronic sensor module of claim 1 including:
first passive optical components attached at the first transparent portion of the optics member, and
second passive optical components attached at the second transparent portion of the optics member,
wherein the first passive optical components are aligned the light emitter and the second passive optical components are aligned with the light detector.

9. The opto-electronic sensor module of claim 8 wherein each of the first and second passive optical components comprises a lens.

10. The opto-electronic sensor module of claim 1 wherein the separation member includes an inorganic filler consisting of small particles selected from a group consisting of graphite, graphene, silicon, metals, and non-transparent minerals.

11. An opto-electronic sensor module comprising:
a substrate;
a light emitter mounted on a first surface of the substrate, the light emitter operable to emit light at a first wavelength;
a light detector mounted on the first surface of the substrate, the light detector operable to detect light at the first wavelength;
an optics member disposed substantially parallel to the substrate, wherein the optics member comprises first and second transparent portions that are transparent to light at the first wavelength, the optics member further comprising a blocking portion that substantially attenuates or blocks incident light at the first wavelength, and wherein the first transparent portion is disposed above the light emitter and the second transparent portion is disposed above the light detector; and a separation member that is disposed between the substrate and the optics member, surrounds the light emitter and the light detector, includes a wall portion that extends from the substrate to the optics member and that separates the light emitter and the light detector from one another, and is composed of a thermosetting polymer material, a UV-curing polymer material or a visible light-curing polymer material, wherein the separation member further includes one or more inorganic fillers that make the separation member substantially non-transparent to light emitted by the light emitter.

12. The opto-electronic sensor module of claim 11 wherein the light emitter comprises a light-emitting diode and the light detector comprises a photodiode.

13. The opto-electronic sensor module of claim 12 wherein the light-emitting diode emits infrared light or near-infrared light and the photodiode detects infrared light or near-infrared light.

14. The opto-electronic sensor module of claim 11 wherein transmission of light through the wall portion at a wavelength of light emitted by the light emitter is no greater than 0.1%.

15. The opto-electronic sensor module of any claim 11 wherein transmission of light through the wall portion at a wavelength of light emitted by the light emitter is no greater than 0.00015%.

16. The opto-electronic sensor module of claim 11 wherein absorbance of light in the wall portion at a wavelength of light emitted by the light emitter is at least 3.

17. The opto-electronic sensor module of claim 11 including:

first passive optical components attached at the first transparent portion of the optics member, and second passive optical components attached at the second transparent portion of the optics member, wherein the first passive optical components are aligned the light emitter and the second passive optical components are aligned with the light detector.

18. The opto-electronic sensor module of claim 17 wherein each of the first and second passive optical components comprises a lens.

19. The opto-electronic sensor module of claim 11 wherein the separation member includes an inorganic filler consisting of small particles selected from a group consisting of graphite, graphene, silicon, metals, and non-transparent minerals.

* * * * *